(12) United States Patent
Pick et al.

(10) Patent No.: US 7,450,631 B2
(45) Date of Patent: Nov. 11, 2008

(54) METRIC CORRECTION FOR MULTI USER DETECTION, FOR LONG CODES DS-CDMA

(75) Inventors: Kobby Pick, Modlin (IL); Daniel Yellin, Raanana (IL); Yoni Perets, Raanana (IL); Lev Smolyar, Haifa (IL)

(73) Assignee: Intel Corporation, Santa Clara, CA (US)

( * ) Notice: Subject to any disclaimer, the term of this patent is extended or adjusted under 35 U.S.C. 154(b) by 1092 days.

(21) Appl. No.: 10/053,490

(22) Filed: Oct. 26, 2001

(65) Prior Publication Data

US 2003/0081701 A1    May 1, 2003

(51) Int. Cl.
 H04B 1/69 (2006.01)
 H04B 1/707 (2006.01)
 H04B 1/713 (2006.01)
(52) U.S. Cl. .................. 375/148; 375/341; 375/346; 455/504; 455/506
(58) Field of Classification Search ............. 375/341, 375/345, 262, 346, 349, 144, 148; 455/504, 455/506
See application file for complete search history.

(56) References Cited

U.S. PATENT DOCUMENTS

| | | | |
|---|---|---|---|
| 5,539,832 A | 7/1996 | Weinstein et al. | |
| 5,930,231 A * | 7/1999 | Miller et al. | 370/210 |
| 6,034,986 A | 3/2000 | Yellin | |
| 6,047,035 A * | 4/2000 | Yellin | 375/346 |
| 6,061,520 A | 5/2000 | Yellin et al. | |
| 6,208,684 B1 | 3/2001 | Yellin et al. | |
| 6,314,130 B1 | 11/2001 | Smolyar et al. | |
| 6,459,398 B1 | 10/2002 | Gureshnik et al. | |
| 6,546,042 B1 | 4/2003 | Yellin et al. | |
| 6,603,823 B1 | 8/2003 | Yellin et al. | |
| 6,618,433 B1 | 9/2003 | Yellin | |
| 6,628,701 B2 | 9/2003 | Yellin | |
| 6,661,832 B1 * | 12/2003 | Sindhushayana et al. | 375/144 |
| 6,674,793 B2 | 1/2004 | Smolyar et al. | |
| 6,741,662 B1 | 5/2004 | Francos et al. | |
| 6,754,251 B1 * | 6/2004 | Sriram et al. | 375/145 |
| 6,801,581 B1 | 10/2004 | Francos et al. | |

(Continued)

FOREIGN PATENT DOCUMENTS

JP    10-233756    9/1998

(Continued)

OTHER PUBLICATIONS

Sklar, "Digital Communications Fundamentals and Applications", year 2000, published by Prentice Hall PTR, pp. 21-22.*

(Continued)

*Primary Examiner*—Phuong Phu
(74) *Attorney, Agent, or Firm*—Fish & Richardson P.C.

(57) ABSTRACT

A receiver in a wireless communication system utilizes a metric to minimize the error probability in transmitted information. The receiver may use a detector utilizing multiuser detection or rake detection. The output symbols of the detector are examined and a metric is obtained related to the noise and interference that may have distorted the transmission of the symbol. This metric is supplied to a channel decoder along with the symbol to improve decoding.

27 Claims, 3 Drawing Sheets

U.S. PATENT DOCUMENTS

| | | |
|---|---|---|
| 6,848,069 B1 | 1/2005 | Levy et al. |
| 6,870,890 B1 | 3/2005 | Yellin et al. |
| 6,895,421 B1 | 5/2005 | Dor et al. |
| 6,895,541 B1 | 5/2005 | Yellin |
| 2002/0025008 A1 | 2/2002 | Jurgensen et al. |
| 2002/0057728 A1 | 5/2002 | Yellin |
| 2002/0061052 A1 | 5/2002 | Smolyar et al. |
| 2002/0181624 A1* | 12/2002 | Gonzalez et al. ............ 375/346 |
| 2002/0194567 A1 | 12/2002 | Yellin et al. |
| 2003/0021337 A1 | 1/2003 | Moshavi et al. |
| 2003/0067962 A1 | 4/2003 | Yellin |
| 2003/0072388 A1 | 4/2003 | Francos et al. |
| 2003/0072396 A1 | 4/2003 | Binshtok et al. |

FOREIGN PATENT DOCUMENTS

| | | |
|---|---|---|
| WO | WO 96/10299 | 4/1996 |
| WO | WO 99/66658 | 12/1999 |
| WO | WO 00/13386 | 3/2000 |
| WO | WO 00/69090 | 11/2000 |

OTHER PUBLICATIONS

Sklar, "Digital Communications Fundamentals and Applications", year 2000, published by Prentice Hall, Inc., p. 30.*

Lee, Y.K., et al. Normalization, windowing and quantization of soft-decision Viterbi decoder inputs in CDMA systems: *IEEE 49th Vehicular Technology Conference*, vol. 1, pp. 221-225, May 1999 (XP002235113).

Ling, F., "Optimal Turbo Decoding Metric Generation in a Pilot Assisted Coherent Wireless Communication System", *IEEE 52nd Vehicular Technology Conference*, vol. 1, pp. 298-302, Sep. 2000.

* cited by examiner

US 7,450,631 B2

METRIC CORRECTION FOR MULTI USER DETECTION, FOR LONG CODES DS-CDMA

TECHNICAL FIELD

This invention relates to channel decoders, and more particularly to applying metric correction to the log-likelihood ratio (LLR) of transmitted symbols.

BACKGROUND

For multiple component codes, optimal decoding is often a very complex task, and may require large periods of time, not usually available for on-line decoding. In order to overcome this problem, iterative decoding techniques have been developed. Rather than determining immediately whether received bits are zero or one, the receiver assigns each bit a value on a multi-level scale representative of the probability that the bit is one.

A soft input channel decoder requires having at its input the log-likelihood ratio (LLR) of the transmitted symbols, or some approximation of the LLR of the transmitted symbols. When using biphase phase shift keying (BPSK), a large positive value of the LLR indicates that the transmitted symbol is a "1" with high probability. A large negative value of the LLR indicates that the transmitted symbol is a "−1" with high probability. A low LLR magnitude implies low confidence in the value of the symbol. The channel decoder then utilizes the sequence of LLR values to decode the transmitted information in a manner that minimizes the error probability. This is possible because the LLR value of each symbol is directly related to the noise and interference that distorted the transmission the corresponding symbol.

Data represented on the multi-level scale is referred to as "soft data," and iterative decoding is usually soft-in/soft-out, i.e., the decoding process receives a sequence of inputs corresponding to probabilities for the bit values and provides as output corrected probabilities taking into account constraints of the code. Generally, a decoder which performs iterative decoding, uses soft data from former iterations to decode the soft data read by the receiver.

DESCRIPTION OF DRAWINGS

Like reference symbols in the various drawings indicate like elements.

DETAILED DESCRIPTION

One embodiment of the present invention determines the LLR value for long-code direct sequence code division multiple access (DS-CDMA). In direct sequence spread spectrum, the stream of information to be transmitted is divided into small pieces, each of which is allocated across the spectrum to a frequency channel. A data signal at the point of transmission is combined with a higher data-rate bit sequence (chipping code) that divides the data according to a spreading ratio. The redundant chipping code helps the signal resist interference and also enables the original data to be recovered if data bits are damaged during transmission. The use of long codes results in interference being proportional to the cross-correlations between the spreading sequences of the different users. These spreading sequences change from symbol to symbol, resulting in a change in the level of multiple access interference (MAI) from symbol to symbol. By using the present invention, the performance of a conventional rake receiver may be improved, especially when the noise level is low and the dominant source of the signal degradation is the MAI.

Figure 1:
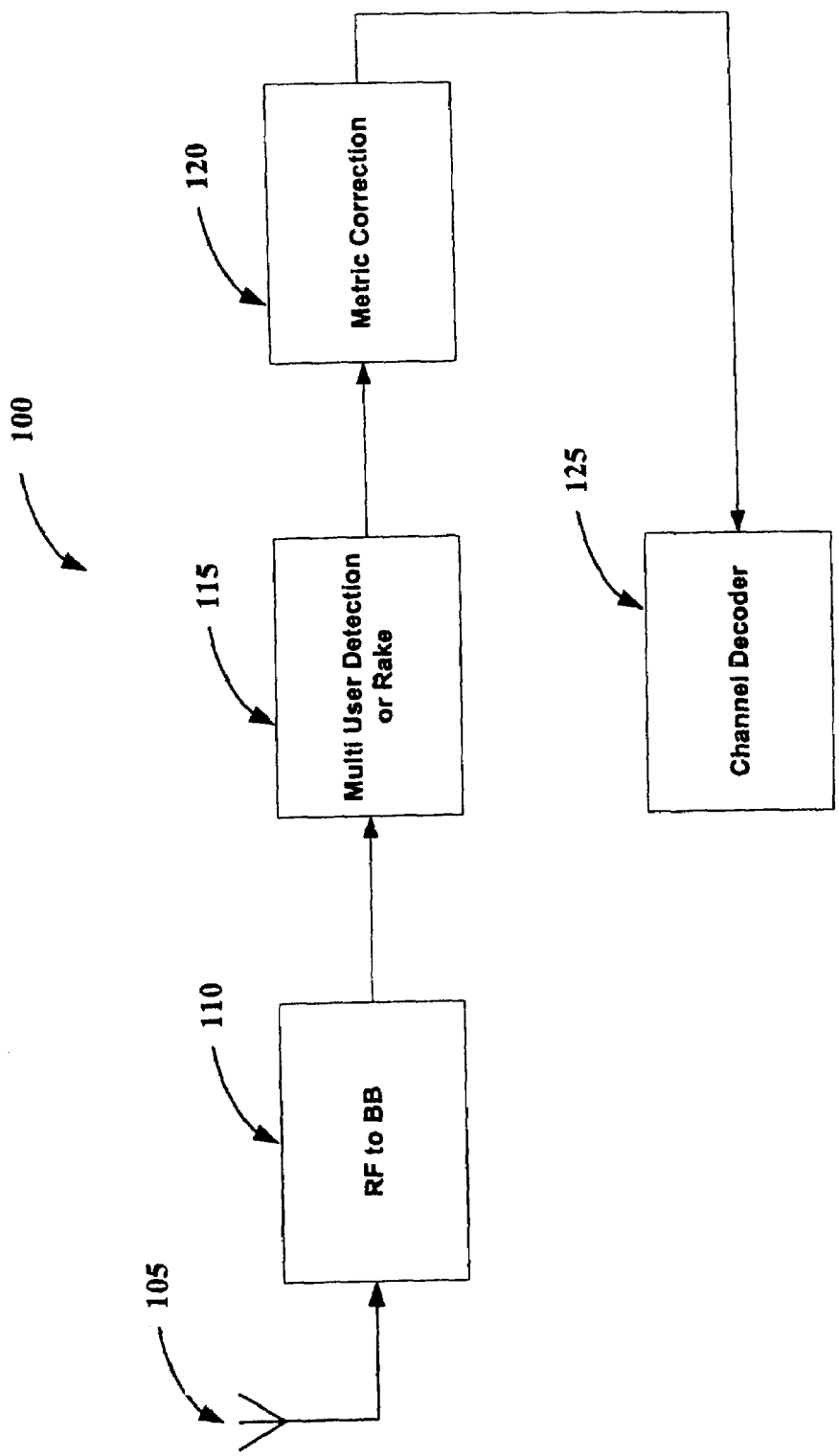
FIG. 1 is a block diagram of the general structure of a receiver according to one embodiment of the invention.

FIG. 1 is a block diagram of the general structure of a receiver 100 according to one embodiment of the invention. A signal is received at an antenna 105 and is then converted to baseband in a radio frequency (RF) to baseband converter 110. The baseband signal is then received by a multiuser detection (MUD) or Rake receiver 115. The term multiuser Detection (MUD) is applied to receivers that take into account the structure of the multiple access interference in CDMA systems. A Rake receiver uses several baseband correlators to individually process several signal multipath components. The correlator out-puts are combined to achieve improved communications reliability and performance. The MUD or Rake produce output symbols based on the baseband signals. These output symbols are provided to the metric correction section 120. The goal of the metric correction is to normalize the Rake or MUD output to obtain the LLR metric in order to provide the channel decoder 125 with the appropriate metric. For long code CDMA, this normalization is performed on a symbol-by-symbol basis because of the time varying nature of the interference.

For BPSK signaling, the LLR of the $n^{th}$ symbol is given by the following equation 1:

$$LLR(n) = \log\left[\frac{p(r(n)/s(n) = 1)}{p(r(n)/s(n) = -1)}\right] = \frac{1}{2\sigma_T^2(n)}[(r(n) - g(n))^2 - (r(n) + g(n))^2] = -\frac{2r(n)g(n)}{\sigma_T^2(n)}$$

where:

r(n) is the detector output of the nth symbol;

g(n) is the time varying gain associated with the desired signal; and $$\sigma_T^2(n)$$

is the total noise variance.

This equation assumes additive white Gaussian noise, which is the common practice in the DS-CDMA setting. However, modifications for other noise and multiple access interference distributions are possible and well known in the art. Further, extensions to other symbol constellations and to different modulations may be performed.

Figure 2:
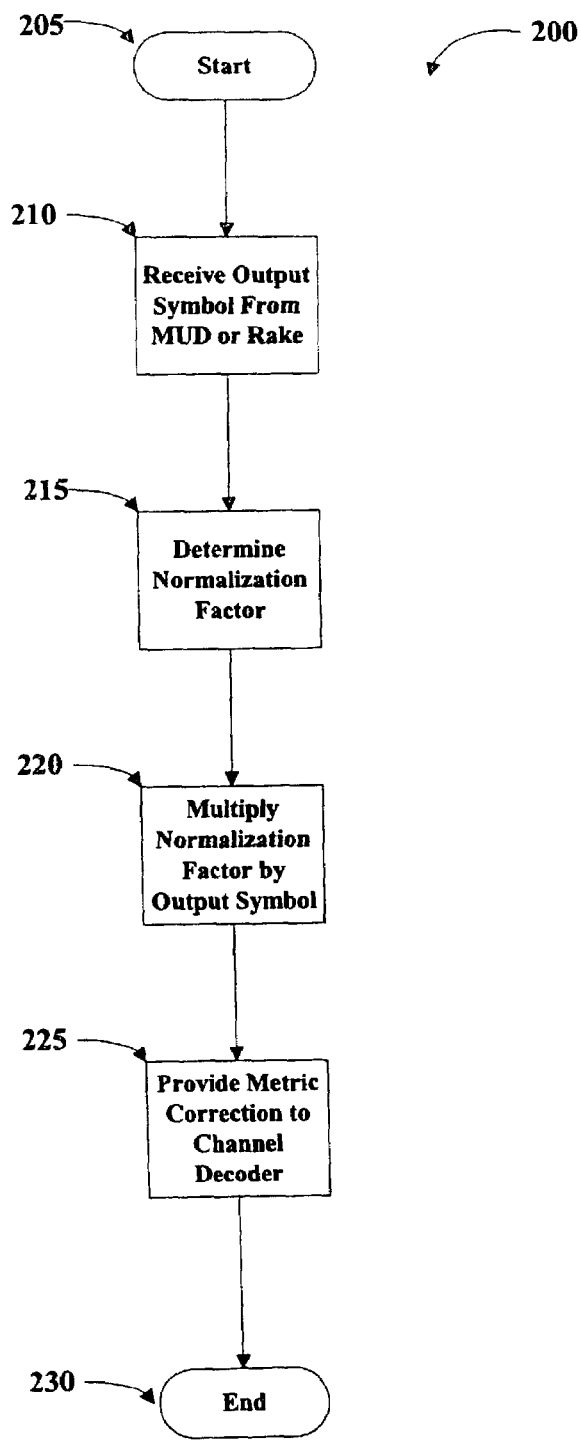
FIG. 2 illustrates the process of normalizing the detector output to obtain the LLR according to one embodiment of the invention.

FIG. 2 illustrates the process 200 of normalizing the detector output to obtain the LLR according to one embodiment of the invention. The process 200 begins in a START block 205. Proceeding to block 210, the process 200 receives the output symbol from the Multiuser Detection or the Rake receiver. The output symbol is composed of three terms:

The desired signal term, which is g(n) multiplied by the transmitted symbol;

The multiple access interference (MAI) term which is assumed to be a white Gaussian process whose variance is denoted by $\sigma_I^2(n)$;

and

The noise term that is assumed to be a white Gaussian process whose variance is denoted by $\sigma_N^2(n)$.

Proceeding to block 215, the process 200 determines the normalization factor. The normalization factor is determined by calculating the gain of the desired term g(n). The variances $\sigma_N^2(n)$ and $\sigma_I^2(n)$ are then calculated. The total noise variance $\sigma_T^2(n)$ is then determined using the following equation:

$$\sigma_T^2(n) \equiv \sigma_I^2(n) + \sigma_N^2(n)$$

The normalization factor is then determined by placing the values of g(n) and $\sigma_T^2(n)$ into Equation 1.

Proceeding to block 220, the process 200 multiplies the normalization factor by the output symbol to determine the metric correction 120. The metric correction 120 is then provided to the channel decoder 125 in block 225. After the channel decoder 125 receives the metric correction 120, the process 200 terminates in the END block 230.

Figures 3, 4:
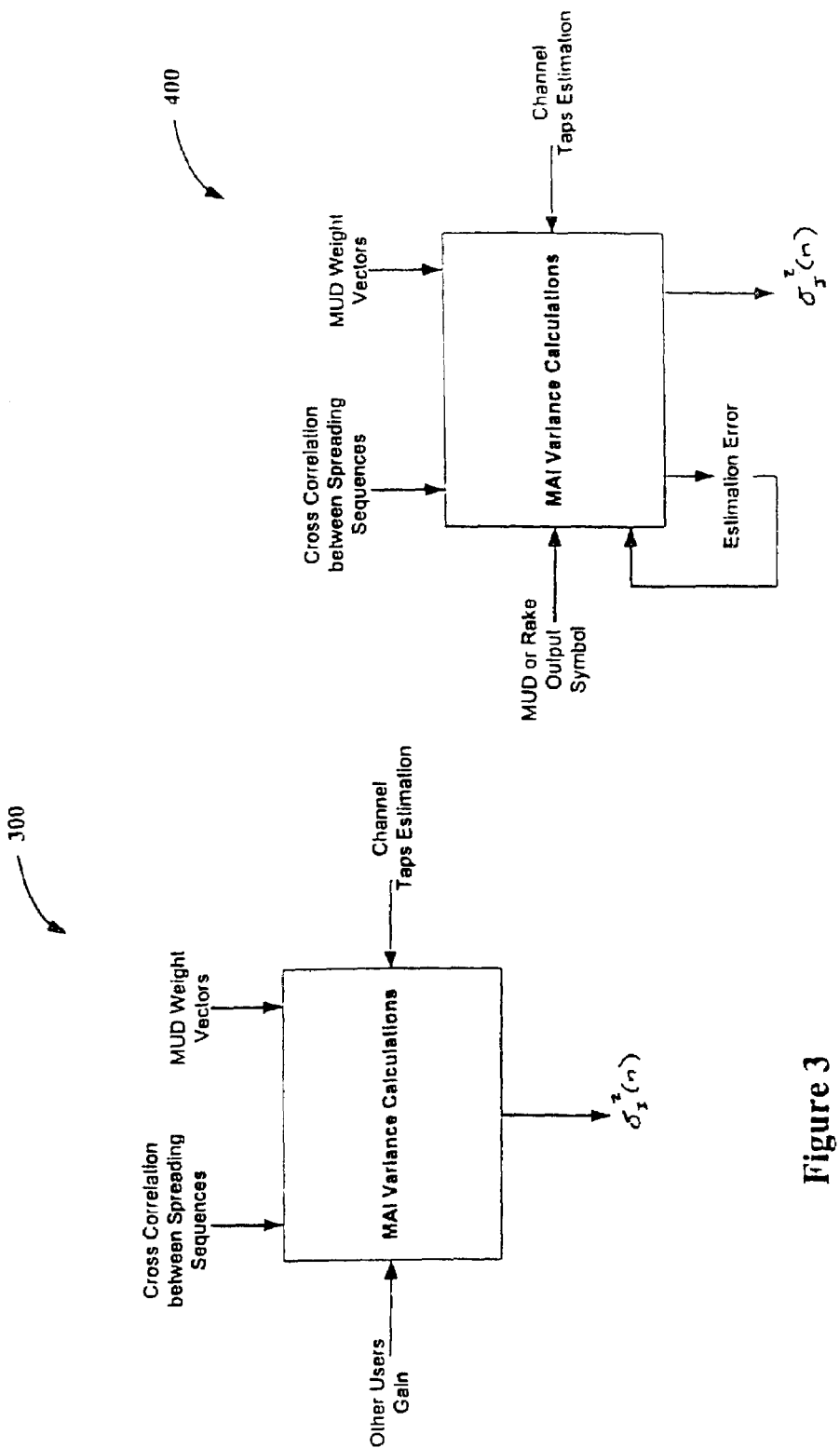
FIG. 3 is a block diagram illustrating the calculation of the variance of the multiple access interference term (MAI) using an analytical technique according to one embodiment of the invention.
FIG. 4 is a block diagram illustrating the estimation of the variance of the multiple access interference term (MAI) using an empirical technique according to one embodiment of the invention.

FIG. 3 is a block diagram 300 illustrating the calculation of the variance of the multiple access interference term (MAI) using an analytical technique according to one embodiment of the invention. As shown above, the exact expression for the LLR is calculated while taking into account the time varying nature of the interference, yet approximating the interference to be Gaussian. The Gaussian approximation is common with MAI, and is a consequence of the central limit theorem when applied to the dispreading operation. When multi-user detection (MUD) is employed, the calculation of the LLRs is even more complicated, as the detection itself is time varying following the variation of the MAI. As shown in the block diagram 300, the MAI Variance Calculation receives a variety of inputs such as the cross correlation between spreading sequences, other users gain, MUD weight vectors, and channel taps estimates. These inputs are used to calculate the MAI variance $\sigma_I^2(n)$.

FIG. 4 is a block diagram 400 illustrating the estimation of the variance of the multiple access interference term (MAI) using an empirical technique according to one embodiment of the invention. The MAI Variance Calculation receives a variety of inputs such as the cross correlation between spreading sequences, the output symbol, MUD weight vectors, and channel taps estimates. These inputs are used to estimate the MAI variance $\sigma_I^2(n)$.

An estimation error is provided in a feedback loop to continually refine the estimation of the MAI variance.

By determining and applying the metric correction 120, the gain of a MUD receiver may be preserved. For example, in the Wideband Code Division Multiple Access (WCDMA) standard 25.101 case 4 channel set-up, a gain of about 3 dB can be achieved with a conventional minimum mean-squared error multiuser detection (MMSE MUD) at the uncoded bit error rate (BER) level compared to the rake receiver. However, the 3 dB gain is lost when examining the block error rate (BLER) performance. By applying the metric correction, the 3 dB gain is obtained for the BLER performance.

A number of embodiments of the invention have been described. Nevertheless, it will be understood that various modifications may be made without departing from the spirit and scope of the invention. Accordingly, other embodiments are within the scope of the following claims.

What is claimed is:

1. A method of normalizing an output of a receiver, the method comprising:
   determining a normalization factor using a determined variance of multiple access interference; and
   applying the normalization factor to the output of the receiver.

2. The method of claim 1, wherein applying the normalization factor comprises normalizing each symbol output from the receiver with a normalization factor that is independent of normalization factors of previous symbols.

3. The method of claim 1, further comprising obtaining a metric correction factor using the normalization factor.

4. The method of claim 3, further comprising providing the metric correction factor to a channel decoder.

5. The method of claim 1, wherein determining the normalization factor comprises determining a log likelihood ratio (LLR) according to the following equation:

$$LLR(n) = -\frac{2r(n)g(n)}{\sigma_T^2(n)}$$

where:
r(n) is the detector output of the $n^{th}$ symbol;
g(n) is the time varying gain associated with the desired symbol; and $\sigma_T^2(n)$ is the total noise variance.

6. The method of claim 5, further comprising determining the variance of multiple access interference analytically.

7. The method of claim 5, further comprising determining the variance of multiple access interference empirically.

8. The method of claim 1, further comprising employing multiuser detection to obtain the output of the receiver.

9. A receiver comprising:
a detector to receive transmitted information and provides one or more output symbols based on the transmitted information;
a metric correction section to normalize the one or more output symbols to obtain a one or more metrics, the normalization based on a determined variance of multiple access interference; and
a channel decoder to receive the one or more metrics from the metric correction section, the channel decoder to utilize the one or more metrics to decode the transmitted information.

10. The receiver of claim 9, wherein the detector comprises a multiuser detector.

11. The receiver of claim 9, wherein the detector comprises a rake detector.

12. The receiver of claim 9, wherein the metric is based on a log likelihood ratio.

13. The receiver of claim 9, wherein the metric correction section determines one or more normalization factors to apply to the one or more output symbols of the detector.

14. The receiver of claim 9, wherein the detector comprises a long code CDMA detector.

15. The receiver of claim 14, wherein the metric correction section is to normalize each output symbol on a symbol by symbol basis with a normalization factor that is independent of the normalization factors of previous symbols.

16. The receiver of claim 9, wherein the metric is based on a log likelihood ratio for BPSK signaling that is determined from the following equation:

$$LLR(n) = -\frac{2r(n)g(n)}{\sigma_T^2(n)}$$

where:
r(n) is the detector output of the $n^{th}$ symbol;
g(n) is the time varying gain associated with the desired symbol; and $\sigma_T^2(n)$ is the total noise variance.

17. The receiver of claim 16, wherein the variance of the multiple access interference is determined analytically.

18. The receiver of claim 16, wherein the variance of the multiple access interference is determined empirically.

19. A method comprising:
receiving one or more output symbols from a detector;
determining a normalization factor for each of the one or more output symbols, each normalization factor being independent of normalization factors for previous output symbols, wherein the normalization factor is determined based on the following equation:

$$LLR(n) = -\frac{2r(n)g(n)}{\sigma_T^2(n)}$$

where:
r(n) is the detector output of the $n^{th}$ symbol;
g(n) is the time varying gain associated with the desired symbol; and $\sigma_T^2(n)$ is the total noise variance;
multiplying each of the one or more output symbols by the corresponding normalization factor to obtain a metric correction; and
providing the metric correction for each symbol to a channel decoder.

20. The method of claim 19, further comprising decoding a transmission using the metric correction.

21. The method of claim 19, further comprising determining a variance of a level of multiple access interference analytically.

22. The method of claim 19, further comprising determining a variance of a level of multiple access interference empirically.

23. A method comprising:
receiving a symbol;
determining a normalization factor for the symbol using a determined variance in a level of multiple access interference for the symbol;
normalizing the symbol with the normalization factor; and
providing the normalized symbol to a channel decoder.

24. The method of claim 23, wherein determining the normalization factor comprises:
determining a time varying gain associated with a desired symbol; and
determining the variance in the level of multiple access interference for the symbol.

25. The method of claim 24, wherein determining the normalization factor further comprises determining the variance in a noise term that is independent of the variance in the level of multiple access interference.

26. The method of claim 23, wherein normalizing the symbol with the normalization factor comprises multiplying the symbol by a log likelihood ratio.

27. The method of claim 26, wherein multiplying the symbol by the log likelihood ratio comprises multiplying the symbol by $$LLR(n) = -\frac{2r(n)g(n)}{\sigma_T^2(n)}$$

where:
r(n) is an output of the symbol;
g(n) is the time varying gain associated with the desired symbol; and $\sigma_T^2(n)$ is the total noise variance.

* * * * *